(12) United States Patent
Wei (10) Patent No.: US 9,219,561 B2
(45) Date of Patent: Dec. 22, 2015

(54) METHOD AND APPARATUS FOR MULTIPLEXING AND DEMULTIPLEXING MULTI-CHANNEL SIGNALS AND SYSTEM FOR TRANSMITTING MULTI-CHANNEL SIGNALS

(75) Inventor: Konggang Wei, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 382 days.

(21) Appl. No.: 13/309,974

(22) Filed: Dec. 2, 2011

(65) Prior Publication Data

US 2012/0075985 A1     Mar. 29, 2012

Related U.S. Application Data

(63) Continuation of application No. PCT/CN2010/073490, filed on Jun. 3, 2010.

(30) Foreign Application Priority Data

Jun. 3, 2009 (CN) .......................... 2009 1 0145591

(51) Int. Cl.
*H04J 3/04* (2006.01)
*H03M 9/00* (2006.01)

(52) U.S. Cl.
CPC . *H04J 3/047* (2013.01); *H03M 9/00* (2013.01)

(58) Field of Classification Search
CPC .................................. H04J 3/047; H03M 9/00
USPC ................................................ 348/489; 3/489
See application file for complete search history.

(56) References Cited

U.S. PATENT DOCUMENTS

| | | | | | |
|---|---|---|---|---|---|
| 3,471,646 | A | * | 10/1969 | Magnusky et al. ........... | 370/201 |
| 3,549,814 | A | * | 12/1970 | Jaeger, Jr. et al. ............. | 370/522 |
| 2011/0142112 | A1 | * | 6/2011 | Lin et al. ........................ | 375/224 |

FOREIGN PATENT DOCUMENTS

| | | | | | |
|---|---|---|---|---|---|
| CN | 1139853 | | * | 1/1997 | .............. H04L 25/00 |
| CN | 1139853 | A | | 1/1997 | |
| CN | 1971540 | | * | 5/2007 | .............. G08F 13/00 |

(Continued)

OTHER PUBLICATIONS

Chen et al ("Informaiton Processing Method and Transmission System using Single Channel Transmitting Multiplex Information" Patent No. CN 1139853 published Jan. 8, 1997).*

(Continued)

*Primary Examiner* — Jung Park
*Assistant Examiner* — Chuong M Nguyen
(74) *Attorney, Agent, or Firm* — Conley Rose, P.C.; Grant Rodolph; Nicholas K. Beaulieu (57) ABSTRACT

A method for multiplexing multi-channel signals includes: acquiring sample signals of K channels of signals by using a first signal, in which K is a natural number greater than or equal to 2, the first signal has a first frequency F1 and the highest frequency of the K channels of signals is a third frequency F3, the first frequency F1 is S times as high as the third frequency F3, and S is the times of sampling by using the first signal in each period; generating a data string containing the sample signals in a preset format; and sending the data string by using a second signal, in which the second signal has a second frequency F2, the second frequency F2 divided by the first frequency F1 is greater than or equal to K, that is, F2/F1≥K. Therefore, the real-time performance of signal processing is enhanced.

17 Claims, 5 Drawing Sheets

(56) References Cited

FOREIGN PATENT DOCUMENTS

| CN | 1971540 A | 5/2007 | | |
|---|---|---|---|---|
| CN | 101577598 A | 11/2009 | | |
| EP | 1280157 A2 | * | 1/2003 | ............. G11B 27/28 |

OTHER PUBLICATIONS

Dietze et al ("Economic Aspects of Time Division Multiplex Data Transmission"—Electrical Communication vol. 48 No. 1 and 2 published 1973).*
Chen, "Information Processing Method and Transmission System using Single Channel Transmission Multiplex Information" CN 1139853 published on Jan. 8, 1997.*
Yang et al, "Control System and Method of Multipath Input Data", CN 1971540 published on May 30, 2007.*
Heo et al, "DVD Audio Disk and Apparatus and a Method for Playing the Same" EP 1280157 published on Jan. 9, 2003.*
Rejection Decision mailed Jun. 13, 2012, issued in related Chinese Application No. CN200910145591.0, Huawei Technologies Co., Ltd. (12 pages).
Extended European Search Report dated (mailed) Mar. 29, 2012, issued in related Application No. 10782977.2-2415, PCT/CN2010073490, Hauwei Technologies Co., Ltd.
Dietze et al., "Economic Aspects of Time Division Multiplex Data Transmission," Electrical Communication vol. 48, No. 1 and 2, XP000807652, Jan. 1973.
Morris, N., "Data Transmission Demonstrations, Circuits for Showing the Principles of Frequency-Division and Time-Division Multiplex Systems," Wireless World, vol. 73, No. 1, XP000797168, Jan. 1967.
Lee, et al., "18.2 Multiple Access by Time Division," in "Digital Communication Second Edition," pp. 770-773, XP-002671414, Kluwer Academic, Norwell, Massachusetts, 1994.
International Search Report from the Chinese Patent Office for International Application No. PCT/CN2010/073490 mailed Sep. 9, 2010.
Written Opinion of the International Searching Authority from the Chinese Patent Office in International Application No. PCT/CN2010/073490 mailed Sep. 9, 2010.
First Chinese Office Action of Chinese Application No. 2009101455910 mailed Apr. 20, 2011.

* cited by examiner

METHOD AND APPARATUS FOR MULTIPLEXING AND DEMULTIPLEXING MULTI-CHANNEL SIGNALS AND SYSTEM FOR TRANSMITTING MULTI-CHANNEL SIGNALS

CROSS-REFERENCE TO RELATED APPLICATIONS

This application is a continuation of International Application No. PCT/CN2010/073490, filed on Jun. 3, 2010, which claims priority to Chinese Patent Application No. 200910145591.0, filed on Jun. 3, 2009, both of which are hereby incorporated by reference in their entireties.

FIELD OF THE INVENTION

The present invention relates to the field of wireless communication technologies, and in particular, to a method and apparatus for multiplexing and demultiplexing multi-channel signals and a system for transmitting multi-channel signals.

BACKGROUND OF THE INVENTION

In electronic products, signals are transmitted between circuits of different hardware units, between components, and between products; therefore, line connections are very common. To reduce line connections, multi-channel signal multiplexing is developed. The multi-channel signal multiplexing superposes multi-channel signals at a low speed onto signals at a high speed. Signal demultiplexing restores the multi-channel signals at the low speed from the signals at the high speed.

The multi-channel signal multiplexing can multiplex multiple channels of signals and uses one bus to send all signals.

The conventional multi-channel signal multiplexing technology needs to use the clock to sample each channel of signal multiple times and lock them. Because each channel of signal is usually sampled more than eight times, a register needs to be used for buffering and temporarily storage. Then, the sample signals are synchronously multiplexed to a high speed data line by using high speed clock signals. This multi-channel multiplexing technology is applicable to the environment between two independent units, which has a low requirement on the time.

To sum up, the inventor finds during the implementation of the present invention that, the prior art has at least the following problem. Because the conventional multi-channel signal multiplexing technology needs to sample each channel of signal multiple times and lock them, and multiplex them after the signals are formed into a data unit or data block, the real-time performance is poor.

SUMMARY OF THE INVENTION

Accordingly, various embodiments of the present invention provide a method and apparatus for multiplexing and demultiplexing multi-channel signals and a system for transmitting multi-channel signals.

One embodiment of the present invention provides a method for multiplexing multi-channel signals. The method includes:

acquiring sample signals of K channels of signals by using a first signal, in which K is a natural number greater than or equal to 2;

the first signal has a first frequency F1 and the highest frequency of the K channels of signals is a third frequency F3;

the first frequency F1 is S times as high as the third frequency F3, and S is the times of sampling by using the first signal in each period;

generating a data string containing the sample signals in a preset format; and sending the data string by using a second signal, in which the second signal has a second frequency F2; the second frequency F2 divided by the first frequency F1 is greater than or equal to K, that is, $F2/F1 \geq K$.

Another embodiment of the present invention provides a method for demultiplexing multi-channel signals. The method includes:

sampling a data string in a preset format by using a second signal, in which the second signal has a second frequency F2;

restoring sample signals of K channels of signals according to the preset format of the data string, in which K is a natural number greater than or equal to 2; and restoring the K channels of signals from the sample signals of the K channels of signals by using a first frequency F1; in which the highest frequency of the K channels of signals is a third frequency F3, the first frequency F1 is S times as high as the third frequency F3, S is the times of sampling by using the first signal in each period, and the second frequency F2 divided by the first frequency F1 is greater than or equal to K, that is, $F2/F1 \geq K$.

One embodiment of the present invention provides an apparatus for multiplexing multi-channel signals. The apparatus includes:

a sampling unit, configured to acquire sample signals of K channels of signals by using a first signal, in which K is a natural number greater than or equal to 2;

the first signal has a first frequency F1 and the highest frequency of the K channels of signals is a third frequency F3;

the first frequency F1 is S times as high as the third frequency F3, and S is the times of sampling by using the first signal in each period;

a generation unit, configured to generate a data string containing the sample signals in the preset format; and a sending unit, configured to send the data string by using a second signal, in which the second signal has a second frequency F2; the second frequency F2 divided by the first frequency F1 is greater than or equal to K, that is, $F2/F1 \geq K$.

Another embodiment of the present invention provides an apparatus for demultiplexing multi-channel signals. The apparatus includes:

a sampling unit, configured to sample a data string in a preset format by using a second signal, the second signal has a second frequency F2;

a first restoration unit, configured to restore sample signals of K channels of signals according to the preset format of the data string, in which K is a natural number greater than or equal to 2; and a second restoration unit, configured to restore the K channels of signals from the sample signals of the K channels of signals by using a first frequency F1; in which the highest frequency of the K channels of signals is a third frequency F3, the first frequency F1 is S times as high as the third frequency F3, S is the times of sampling by using the first signal in each period, and the second frequency F2 divided by the first frequency F1 is greater than or equal to K, that is, $F2/F1 \geq K$.

One embodiment of the present invention provides a system for transmitting multi-channel signals. The system includes any apparatus for multiplexing multi-channel signals and any apparatus for demultiplexing multi-channel signals according to embodiments of the present invention.

The apparatus for multiplexing multi-channel signals is configured to: acquire sample signals of K channels of signals by using a first signal, in which K is a natural number greater than or equal to 2, the first signal has a first frequency F1, the highest frequency of the K channels of signals is a third frequency F3, the first frequency F1 is S times as high as the third frequency F3, and S is the times of sampling by using the first signal in each period;

generate a data string containing the sample signals in a preset format; and send the data string by using a second signal, the second signal has a second frequency F2; in which the second frequency F2 divided by the first frequency F1 is greater than or equal to K, that is, F2/F1≥K;

the apparatus for demultiplexing multi-channel signals is configured to: sample the data string in a preset format by using a second signal, in which the second signal has a second frequency F2;

restore the sample signals of the K channels of signals according to the preset format of the data string, in which K is a natural number greater than or equal to 2; and restore the K channels of signals from the sample signals of the K channels of signals by using a first frequency F1; in which the highest frequency of the K channels of signals is a third frequency F3, the first frequency F1 is S times as high as the third frequency F3, S is the times of sampling by using the first signal in each period, and the second frequency F2 divided by the first frequency F1 is greater than or equal to K, that is, F2/F1≥K.

Compared with the prior art, the present invention has the following advantages:

According to the embodiments of the present invention, sample signals of K channels of signals are acquired by using the first signal, in which K is a natural number greater than or equal to 2. The first signal has the first frequency F1, the highest frequency of the K channels of signals is the third frequency F3, the first frequency F1 is S times as high as the third frequency F3, and S is the times of sampling by using the first signal in each period. The data string containing the sample signals is generated in a preset format. The data string is sent by using the second signal, the second signal has the second frequency F2; and the second frequency F2 divided by the first frequency F1 is higher than or equal to K. Accordingly, the multiple channels of signals may be sent at a high speed by using the second signal after being sampled in real time, and when the multiplexed signal is received, the data string may be quickly demultiplexed in real time and then the original multiple channels of signals may be restored in real time. This obviously reduces the time required for locking and saving the multiple channels of signals in the prior art, enhances the speeds of multiplexing, demultiplexing, transmitting, and receiving, and solves the technical problems related to the real-time performance in the prior art.

BRIEF DESCRIPTION OF THE DRAWINGS

To illustrate the technical solutions according to the embodiments of the present invention or in the prior art more clearly, the accompanying drawings for describing the embodiments are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

The technical solution of the present invention will be clearly and completely described in the following with reference to the accompanying drawings. It is obvious that the embodiments to be described are only a part rather than all of the embodiments of the present invention. All other embodiments obtained by persons skilled in the art based on the embodiments of the present invention without creative efforts shall fall within the protection scope of the present invention.

Embodiment 1

Figure 1:
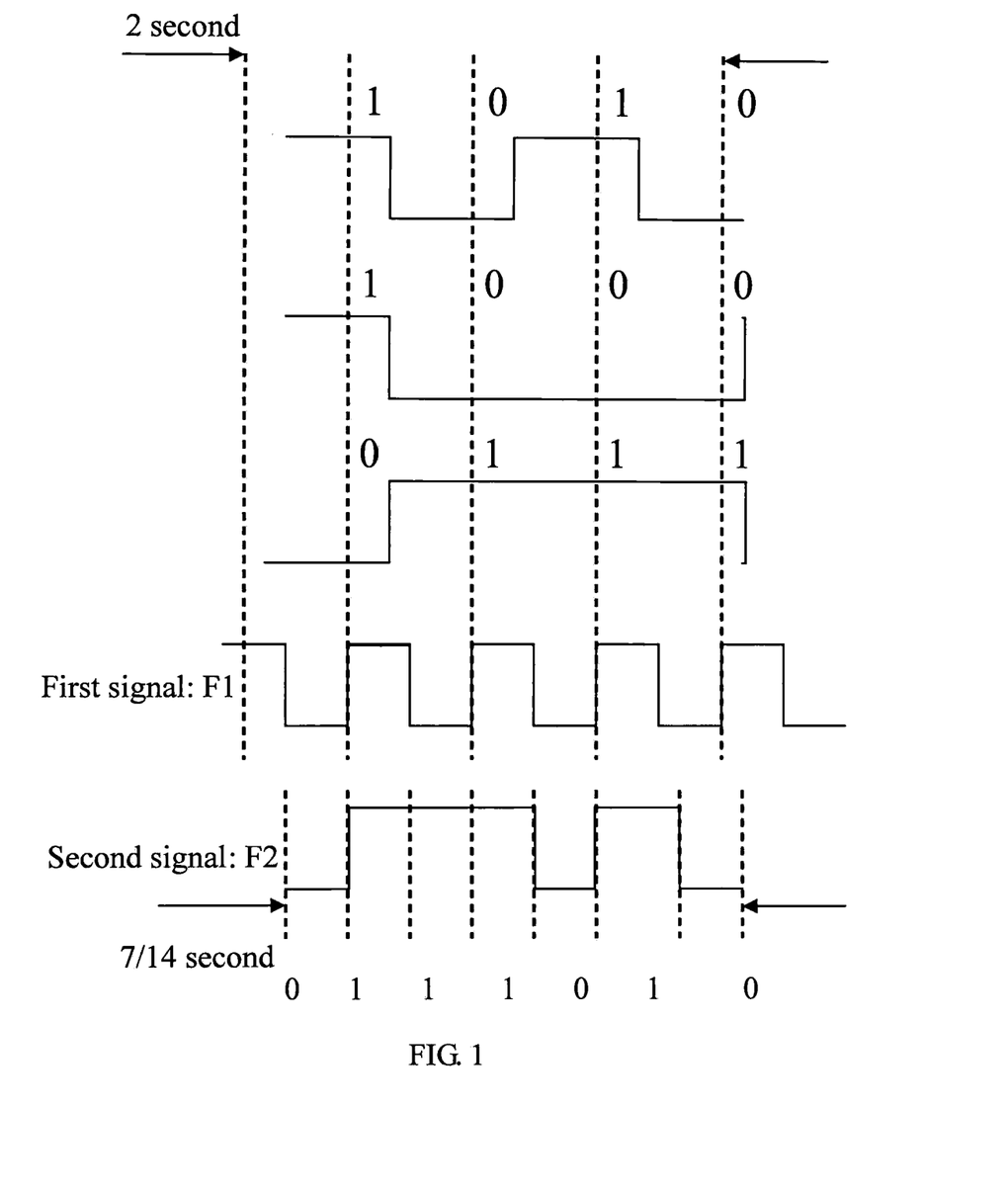
FIG. 1 is a schematic diagram of signal sampling according to Embodiment 1 of the present invention.

As shown in FIG. 1, a signal sampling schematic diagram according to Embodiment 1 of the present invention is illustrated. The first signal is 1010, the second signal is 1000, and the third signal is 0111. If K is used to represent the number of channels of the signals, K=3. The highest frequency of the three channels of signals is 1 Hz and they are synchronous. The first frequency F1 of the first signal is 2 Hz. The signal sampling process includes the following steps.

Step 101: Among these three channels of signals, the first signal is used for sampling. Signal sampling is performed once a period and the sampling points are the three channels of signals aligned with the rising edge of the first signal. Then, a signaling point 110 is acquired. The sampling points 2, 3, and 4 are 001, 101, 001 and the sampling of three channels of signals takes about 2 seconds. Because the signals are sent in real time according to this embodiment, the process of sampling signals and sending the three channels of signals takes 2 seconds.

Step 102: The sampled data at each sampling point is formed into a data string in a preset format. It is assumed that in this embodiment, the sum of lengths of the data header and the data tail of the data string is Y=4, the data header is 01, the data tail is 10, the generated data string is changed to 0111010 for the first sampling point, the generated data string is changed to 0100110 for the second sampling point, and so on.

In practical application, considering the real-time data transmission, the data header and data tail are not needed, and the sampling points need to be directly transmitted. In addition, the check bit may be added to improve the accuracy of data transmission.

Step 103: The data string is sent by using the second signal. If the data string contains a data header and a data tail, and data string 0111010 is sent. In this embodiment, the second frequency F2 of the second signal is set to 14 Hz.

The sending time is: the length of the data string/the second frequency=7/14=0.5 second.

Similarly, the last bits of the signals on channels 1 to 3 are sent in turn after a complete sampling period. To be specific, signal 1010 on channel 1, signal 1000 on channel 2, and signal 0111 on channel 3, sampling points 1, 2, 3, and 4 of all channels of signals form a data string.

Step 104: The data string sent by the second signal is received and the second signal having second frequency F2 is used to collect the data string.

Step 105: The data header 01 and the data tail 10 are removed from the data string to obtain a data string 110, that is, the sampled three channels of signals.

Step 106: The data string 110 is restored into signal 1 on channel 1, signal 1 on channel 2, and signal 0 on channel 3 by using the first signal. The last bits of the signals on channels 1 to 3 are restored in turn after a complete sampling period, that is, signal 1010 on channel 1, signal 1000 on channel 2, and signal 0111 on channel 3.

In steps 104 to 106, the receiving time is: the length of the data string/the frequency of the second signal=7/14=0.5 second.

In the prior art, signal 1 (10100000), signal 2 (10000000), and signal 3 (011100000) are used as examples to illustrate the technical solution. It is assumed that each signal has eight bits and the highest frequency of the signal is 1 Hz. If the data are transmitted in parallel when the first signal having a frequency of 2 Hz is used, at least 4 seconds are required for transmitting the data. If the data is transmitted by using the serial port and the frequency of the carrier on the serial port is 14 Hz, at least 24/14=1.71 seconds are required for transmitting data containing no data header and data detail. If the technical solution described in this embodiment is applied to the preceding signals, only 3/14 second is required for transmitting the data containing no data header and data tail by using the preceding signal. Therefore, the time required for transmitting data using the parallel port is 4/(3/14)=18.7 times of the time required for transmitting data using the technical solution provided in this embodiment; and the time required for transmitting data using the serial port is (24/14)/(3/14)=8 times of the time required for transmitting data using the technical solution provided in this embodiment. According to this embodiment of the present invention, the data string may be quickly demultiplexed and the original multiple channels of signals may be restored in real time. This obviously reduces the time required for locking and saving the multiple channels of signals in the prior art, enhances the speed of multiplexing, demultiplexing, transmitting, and receiving data, and solves the technical problems related to real-time performance in the prior art.

The following section describes the processing process of three or more channels of signals according to an embodiment of the present invention.

Embodiment 2

Figure 2:
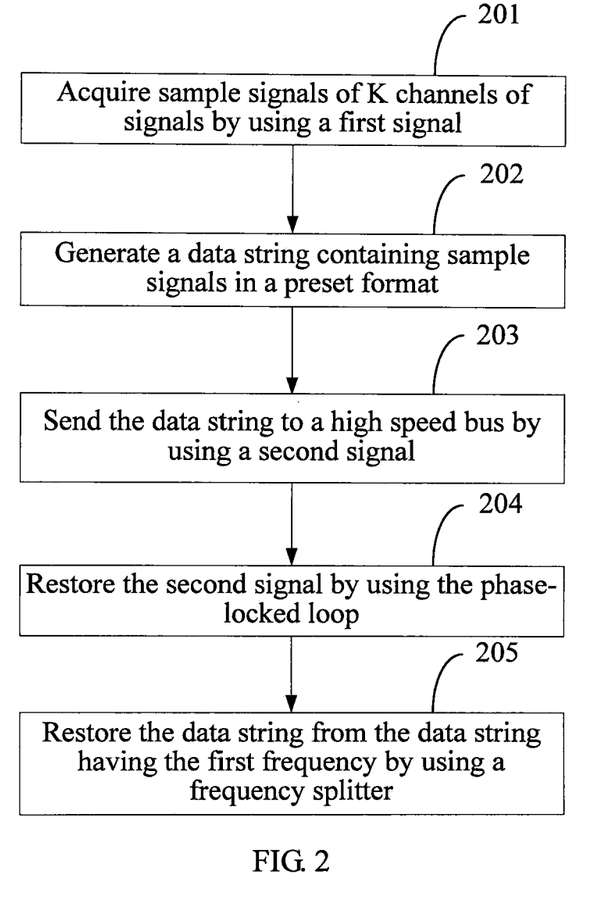
FIG. 2 is a flow chart according to Embodiment 2 of the present invention.

As shown in FIG. 2, the flow chart according to Embodiment 2 is illustrated, which includes the following steps.

Figure 3:
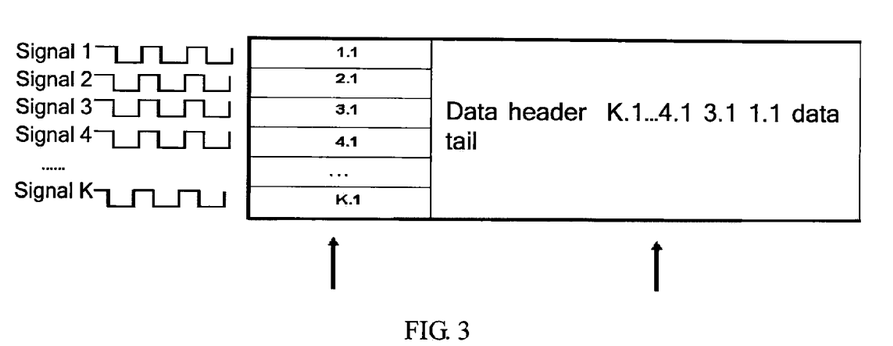
FIG. 3 is a schematic diagram of the sampling when the sampled signals are synchronous.

Step 201: For K channels of signals, for example, signal 1, signal 2, . . . , and signal K, the sample signals of the K channels of signals are acquired by using a first signal. Within the sampling period using the first signal, each channel of signal is sampled only once, that is, only one point is sampled. The first signal has a first frequency F1, and the first frequency F1 is higher than the frequency of any signal among the K channels of signals. As shown in FIG. 3, sample signals sampled from signal 1, signal 2, . . . , and signal K include K sampling points: 1.1, 2.1, . . . , and K.1.

Exemplarily, according to embodiments of the present invention, each channel of signal among the K channels of signals is sampled at the same time for once to seven times by using the first signal. The acquired signals are used as sample signals.

The highest frequency of the K channels of signals is the third frequency F3. The first frequency F1 is S times as high as the third frequency F3, that is, F1=S×F3. S is the times of sampling in each period by using the first signal.

Step 202: The data string containing the sample signals is generated in a preset format. The K channels of sample signals may be directly inserted into the data string in the preset format. The data string in the preset format may also include a data header, a data tail, and a check bit. The acquired data string includes one sampling point of each channel of signal among the K channels of signals.

Step 203: The data string is sent to a high speed bus by using the second signal. The second signal has a second frequency F2. The second frequency F2 divided by the first frequency F1 is greater than or equal to K, that is, F2/F1≥K. If the data string further includes a data header and a data tail, and it is assumed that the sum of lengths of the data header and the data tail is Y, the second frequency F2 divided by the first frequency F1 is greater than or equal to a sum of K and Y, that is, F2/F1≥K+Y.

The first frequency F1 and the second frequency F2 may be expressed by formulas as follows.

For the first frequency F1, the maximum frequency of the signal among of K channels of signals is Fx, $$F1 \geq S \times Fx$$

$$F2 \geq (K+Y) \times F1 = (K+Y) \times S \times Fx.$$

S is the times of sampling in each period by using the first signal. According to Nyquist Theorem, if the sampling frequency is two times as high as the frequency of the sampled signal, the more times of sampling in each period are, the more precise the restored signals are, and the closer the restored signals to the signals before sampling. If the sampling point is close to infinite, the restored signals are the same as the signals before sampling.

It is assumed that eight channels of signals exist and 8 bits are sampled per second during the sampling. The serial port is used for data transmission, and therefore 8 bits need to be transmitted per second to ensure the real-time requirements. Otherwise, data congestion might occur.

When the sampled signals are synchronous, the sampling schematic diagram can be referred to FIG. 3.

Figure 4:
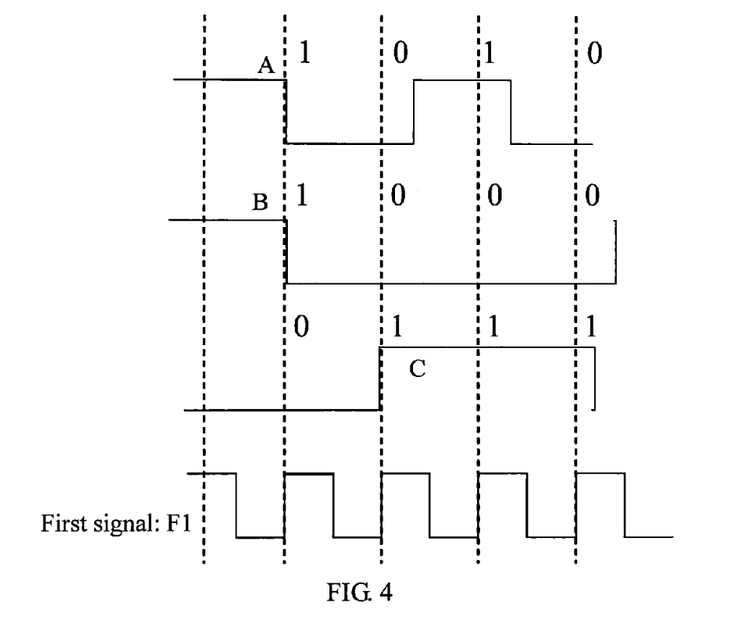
FIG. 4 is a schematic diagram of the sampling when the sampled signals are asynchronous.

When the sampled signals are asynchronous, the sampling schematic diagram can be referred to FIG. 4.

The value of S is subject to the synchronization between the sampled signals in addition to the precision of signals. If the sampled K channels of signals are synchronous with each other, all K channels of signals can be restored as long as the signal whose frequency is the highest among the K channels of signals can be restored. This is because the other channels of signals having lower frequencies definitely meet the Nyquist Theorem and can be restored accurately. Therefore, S may take the minimum value 2.

If the sampled K channels of signals are asynchronous with each other, and S needs to take a greater value than the case where the signals are synchronous. This is because, when the sampled signals are asynchronous, the sampling of the sampled signals is performed on the raising edge or falling edge of the first signal. If the sampling is performed by using the first signal, the signals to be sampled enter the raising edge or falling edge of the first signal. In such a case, a sampling error occurs. This case is shown as points A, B, and C in FIG. 4. For the purpose of eliminating the possibility of the sampling error, the frequency of the first signal needs to be improved. If the frequency of the first signal is sufficiently high such that the issue on whether the sampled signals enter the raising edge or falling edge can be ignored. That is, the impact of the sampling error on the signal restoration can be ignored. To achieve the preceding objective, a clock signal generator with high performance needs to be used or the algorithm complexity is enhanced.

According to the estimation in this embodiment, if the value of S is greater than or equal to 16, the asynchronous sampled signals can be sampled and restored successfully to achieve good effects. Especially in some application scenarios, if the sampled signals are all low-speed signals and are asynchronous with each other, the value of S may be set higher. In such a case, the restored signals are close to the sampled signals.

According to the frequency and data string format of the second signal and the first signal, synchronization relationship of the sampled signals, the number of the sampled signals, mapping relationship between the highest frequency of the sampled signals and the sampling times within a period, the complexity of the implementation of this embodiment depends on the synchronization relationship of the sampled signals, the number of sampled signals, the highest frequency of the sampled signals and the sampling times S within the same period. In addition, in some cases, the complexity is also related to the bus technology and transmission distance. In the application of the embodiment of the present invention, if the frequency of the second signal can keep increasing, all the number of channels of the sampled signals, the highest frequency, and the value of S can keep increasing.

Step 204: After the second signal is received from the high speed bus, the second signal is restored by using a phase-locked loop. The data string having the first frequency F1 is restored by using the phase-locked loop having the second frequency F2. The clock signal generated by the phase-locked loop is stable and reliable. Further, the data string may be restored by using software decoding.

Step 205: The data string is restored from the data string having the first frequency F1 by using a frequency splitter. Because the data string contains sample signals of the K channels of signals, the sampling points of each channel of signal may be restored according to the preset data frame format. All the channels of signals may be completely restored according to the sampling points of the continuously restored channels of signals. The principle and process of steps 204 and 205 for signal demultiplexing are similar to those of Embodiment 1, and the demultiplexing is a reverse process of signal multiplexing.

Based on the preceding embodiments, in each sampling period, 2-7 bits of each channel of signal may be sampled. As compared with the prior art where 8 bits or a multiple of 8 bits of each channel of signal need to be sampled, the data quantity of sampling 2-7 bits according to this embodiment of the present invention is far smaller than that of the prior art. Although the real-time performance of the embodiment is slightly weaker than the sampling in each sampling period once, the real-time performance of the embodiment is acceptable under different real-time performance requirements.

The preceding embodiments of the present invention may be applied to mobile terminals, portable terminals, and between circuit modules and modules of the system device, such as between the mobile phone main printed circuit board (PCB) and the light emitting diode (LED) screen, between the portable machine and the display, and between modules inside the device. The data signals, control signals, and status signals may be multiplexed on a group of transmission lines. For example, when the embodiments are applied between the central processing units (CPU) and the memories or peripheral components, pins used for the components may be reduced, which reduces the encapsulation cost of the semiconductors, cuts down the product development cost, lower the PCB design and manufacturing cost and the device cost.

Figure 5:
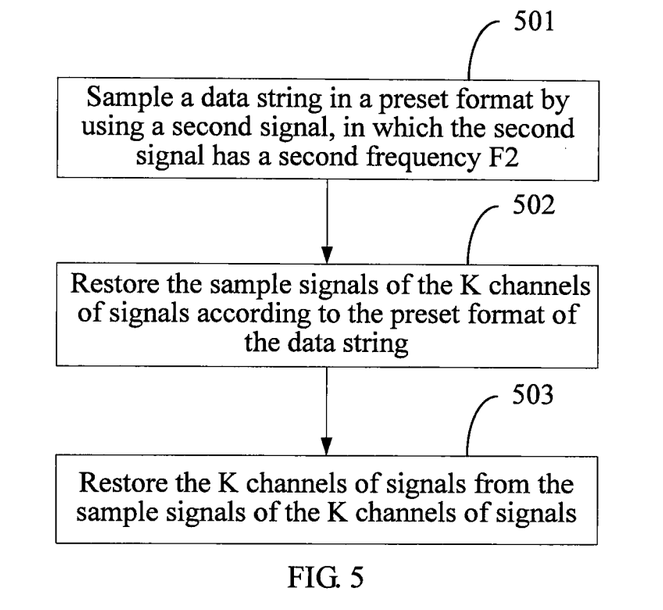
FIG. 5 is a flow chart of a method for demultiplexing multi-channel signals according to an embodiment of the present invention.

Similar to the preceding embodiments, as shown in FIG. 5, this embodiment provides a method for demultiplexing multi-channel signals. The method includes the following steps.

Step 501: A data string is sampled in a preset format by using a second signal, in which the second signal has a second frequency F2.

Step 502: The sample signals of K channels of signals are restored according to the preset format of the data string, in which K is a natural number greater than or equal to 2.

Step 503: The K channels of signals are restored from the sample signals of the K channels of signals by using a first frequency F1; in which the highest frequency of the K channels of signals is a third frequency F3, the first frequency F1 is S times as high as the third frequency F3, that is, $F1 = S \times F3$, S is the times of sampling by using the first signal in each period, and the second frequency F2 divided by the first frequency F1 is greater than or equal to K, that is, $F2/F1 \geq K$.

The restoring K channels of signals from the sample signals of the K channels of signals by using the first frequency F1 includes:

acquiring one to seven sampling points of the K channels of signals from the sample signals by using the first frequency F1.

If the K channels of signals are synchronous, S is greater than or equal to 2.

If the K channels of signals are asynchronous, S is greater than or equal to 16.

The data string further includes a data header and a data tail, and if the sum of lengths of the data header and the data tail being Y, second frequency F2 divided by first frequency F1 is greater than or equal to a sum of K and Y, that is, $F2/F1 \geq K+Y$.

According to the embodiments of the present invention, the method for demultiplexing multi-channel signals reduces the data receiving time, enhances the real-time performance during the data transmission, reduces the pins used for the components. Therefore, the encapsulation cost of semiconductors, the product development cost, the PCB design and manufacturing cost, and the device cost are reduced.

Embodiment 3

Figure 6:
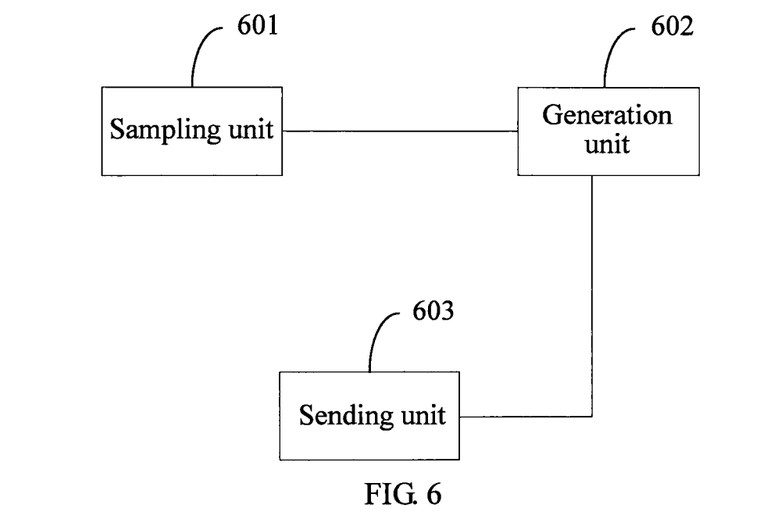
FIG. 6 is a schematic diagram of an apparatus for multiplexing multi-channel signals according to an embodiment of the present invention.

As shown in FIG. 6, this embodiment provides an apparatus for multiplexing multi-channel signals. The apparatus includes:

a sampling unit 601, configured to acquire sample signals of K channels of signals by using a first signal, in which K is a natural number greater than or equal to 2;

the first signal has a first frequency F1 and the highest frequency of the K channels of signals is a third frequency F3;

the first frequency F1 is S times as high as the third frequency F3, S is the times of sampling by using the first signal in each period;

a generation unit 602, configured to generate a data string containing the sample signals in the preset format; and a sending unit 603, configured to send the data string by using a second signal, in which the second signal has a second frequency F2; the second frequency F2 divided by the first frequency F1 is greater than or equal to K, that is, $F2/F1 \geq K$.

Exemplarily, according to embodiments of the present invention, the sampling unit 601 samples each channel of signal among the K channels of signals once to seven times by using the first signal and using the sampled signals as sample signals.

If the K channels of signals are synchronous, S is greater than or equal to 2.

If the K channels of signals are asynchronous, S is greater than or equal to 16.

The data string further includes a data header and a data tail, and if the sum of lengths of the data header and the data tail is Y, the second frequency F2 divided by the first frequency F1 is greater than or equal to a sum of K and Y, that is, $F2/F1 \geq K+Y$.

According to the embodiment of the present invention, the data string may be quickly demultiplexed and the original multiple channels of signals may be restored in real time. This obviously reduces the time required for locking and saving the multiple channels of signals in the prior art, enhances the speed of multiplexing, demultiplexing, transmitting, and receiving data, and solves the technical problems related to the real-time performance in the prior art. In addition, the real-time performance during the data transmission is also enhanced and the pins used for the components are reduced. Therefore, the encapsulation cost of semiconductors, the product development cost, the PCB design and manufacturing cost, and the device cost are reduced.

Embodiment 4

Figure 7:
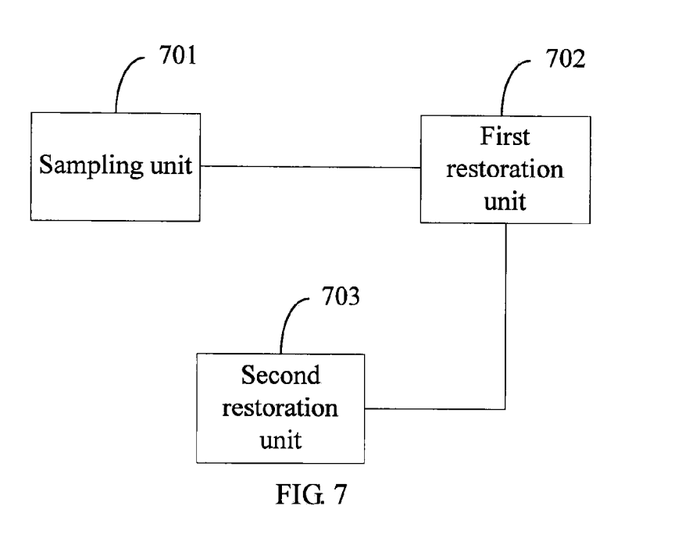
FIG. 7 is a schematic diagram of an apparatus for demultiplexing multi-channel signals according to an embodiment of the present invention.

As shown in FIG. 7, this embodiment of the present invention provides an apparatus for demultiplexing multi-channel signals. The apparatus includes:

a sampling unit 701, configured to sample a data string in a preset format by using a second signal, in which the second signal has a second frequency F2;

a first restoration unit 702, configured to restore sample signals of K channels of signals based on the preset format of the data string, in which K is a natural number greater than or equal to 2; and a second restoration unit 703, configured to restore the K channels of signals from the sample signals of the K channels of signals by using a first frequency F1; in which the highest frequency of the K channels of signals is a third frequency F3, the first frequency F1 is S times as high as the third frequency F3, S is the times of sampling by using the first signal in each period, and the second frequency F2 divided by the first frequency F1 is greater than or equal to K, that is, $F2/F1 \geq K$.

Exemplarily, in this embodiment, the second restoration unit obtains one to seven sampling points of the K channels of signals from the sample signals by using the first frequency F1.

If the K channels of signals are synchronous, S is greater than or equal to 2.

If the K channels of signals are asynchronous, S is greater than or equal to 16.

The data string further includes a data header and a data tail, and if the sum of lengths of the data header and the data tail is Y, the second frequency F2 divided by the first frequency F1 is greater than or equal to a sum of K and Y, that is, $F2/F1 \geq K+Y$.

The apparatus for demultiplexing multi-channel signals according to this embodiment of the present invention achieves the same technical effects as the method embodiments.

Embodiment 5

Figure 8:
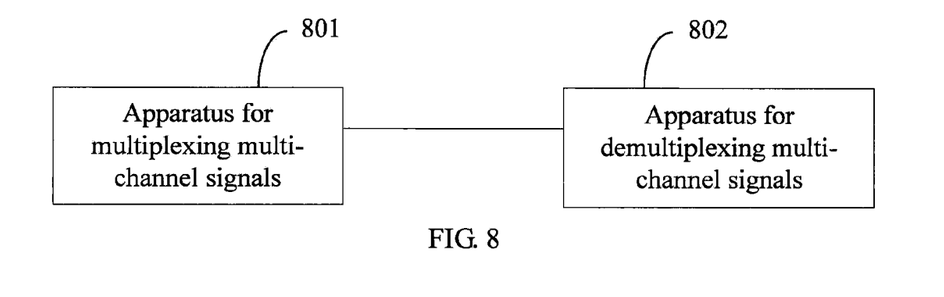
FIG. 8 is a schematic diagram of a system for transmitting multi-channel signals according to an embodiment of the present invention.

As shown in FIG. 8, Embodiment 5 provides a system for transmitting multi-channel signals. The system includes an apparatus for multiplexing multi-channel signals 801 and an apparatus for demultiplexing multi-channel signals 802.

The apparatus for multiplexing multi-channel signals 801 may be any apparatus for multiplexing multi-channel signals according to the embodiments of the present invention.

The apparatus for multiplexing multi-channel signals is configured to: acquire sample signals of K channels of signals by using a first signal, in which K is a natural number greater than or equal to 2, the first signal has a first frequency F1, the highest frequency of the K channels of signals is a third frequency F3, the first frequency F1 is S times as high as the third frequency F3, and S is the times of sampling by using the first signal in each period;

generate a data string containing the sample signals in a preset format; and send the data string by using a second signal, in which the second signal has a second frequency F2; the second frequency F2 divided by the first frequency F1 is greater than or equal to K, that is, $F2/F1 \geq K$.

The apparatus for demultiplexing multi-channel signals is configured to: sample the data string in a preset format by using a second signal, in which the second signal has a second frequency F2;

restore sample signals of the K channels of signals according to the preset format of the data string, in which K is a natural number greater than or equal to 2; and restore the K channels of signals from the sample signals of the K channels of signals by using a first frequency F1; in which the highest frequency of the K channels of signals is a third frequency F3, the first frequency F1 is S times as high as the third frequency F3, S is the times of sampling by using the first signal in each period, and the second frequency F2 divided by the first frequency F1 is greater than or equal to K, that is, $F2/F1 \geq K$.

According to the embodiments of the present invention, sample signals of the K channels of signals are acquired by using the first signal, in which K is a natural number greater than or equal to 2. The first signal has the first frequency F1, the highest frequency of the K channels of signals is the third frequency F3, the first frequency F1 is S times as high as the third frequency F3, and S is the times of sampling by using the first signal in each period. The data string containing the sample signals is generated in a preset format. The data string is sent by using the second signal, in which the second signal has the second frequency F2. The second frequency F2 divided by the first frequency F1 is higher than or equal to K. Accordingly, the multiple channels of signals may be sent at a high speed by using the second signal after being sampled in real time. The data string may be quickly demultiplexed and the original multiple channels of signals may be restored. This obviously reduces the time required for locking and saving the multiple channels of signals in the prior art, enhances the speed of multiplexing, demultiplexing, transmitting, and receiving data, and solves the technical problems related to real-time performance in the prior art.

The embodiments of the present invention may be applied to mobile terminals, portable terminals, and between circuit modules and modules of the system device, such as between the mobile phone main printed circuit board (PCB) and the LED screen, between the portable machine and the display, and between modules inside the device. The data signals, control signals, and status signals may be multiplexed on a group of transmission lines. For example, when the embodiments are applied between the central processing units (CPU) and the memories or peripheral components, pins used for the components may be reduced, which reduces the encapsulation cost of the semiconductors, cuts down the product development cost, lower the PCB design and manufacturing cost and the device cost.

Through the above description of the implementation, it is clear to persons skilled in the art that the present invention may be accomplished through software plus a necessary universal hardware platform or through hardware of course. Based on this, the technical solutions or the part that makes contributions to the prior art of the present invention can be substantially embodied in the form of a software product. The computer software product may be stored in one or more storage media and contain several instructions adapted to instruct computer equipment (for example, a personal computer, a server, or network equipment) to perform the methods according to the embodiments of the present invention.

The above embodiments are not intended to limit the scope of the technical solution. Any modification, equivalent replacement, and improvement made without departing from the spirit and principle of the present invention shall fall within the protection scope of the present invention.

It should be understood that the method according to embodiments of the present invention may be implemented in the form of software functional module and functions as an independent product for sale or use, and it may also be stored in a computer readable storage medium. The preceding storage medium may be a read-only memory (ROM), a magnetic disk or an optical disk.

Various function units in embodiments of the present invention may be integrated in a processing module, or physical independent entities; or two or more function units may be integrated into one module. The preceding integrated module may be not only implemented in the form of hardware, but also implemented in the form of software function module. If the integrated module is implemented in the form of software functional module and functions as an independent product for sale or use, it may also be stored in a computer readable storage medium. The preceding computer readable storage medium may be a ROM, a magnetic disk or an optical disk.

Finally, it should be noted that the above embodiments are merely provided for describing the technical solutions of the present invention, but not intended to limit the present invention. It should be understood by persons of ordinary skill in the art that although the present invention has been described in detail with reference to the exemplary embodiments, modifications or equivalent replacements can be made to the technical solutions of the present invention, as long as such modifications or replacements do not depart from the spirit and scope of the technical solution of the present invention.

What is claimed is:

1. A method for multiplexing multi-channel signals, comprising:
   acquiring a plurality of sample signals from a K number of channel signals by using a first signal;
   generating a data string comprising the sample signals in a preset format, wherein the preset format comprises a data header, a data tail, and the plurality of sample signals from the K number of channel signals between the data header and the data tail; and
   sending the data string to a high speed bus by using a second signal,
   wherein the second signal is set to a second frequency $F2$,
   wherein the first signal has a first frequency $F1$,
   wherein a third frequency $F3$ represents a highest frequency amongst the K number of channel signals,
   wherein the first frequency $F1$ is S times as high as the third frequency $F3$,
   wherein S is the times of sampling using the first signal in each period,
   wherein the second frequency $F2$ is set to a frequency such that the second frequency $F2$ is greater than or equal to a sum of K and Y multiplied by S and $F3$, that is, $F2 \geq (K+Y) \times S \times F3$,
   wherein K is a natural number greater than or equal to 2 that indicates the number of channel signals to multiplex, Y is a sum of lengths of the data header and the data tail, S is the times of sampling, and $F3$ is the highest frequency amongst the K number of channel signals,
   wherein acquiring the sample signals from the K number of channel signals by using the first signal comprises sampling each of the K number of channel signals at a same time at one or more edges of the first signal,
   wherein each of the K number of channel signals are sampled less than eight times using the edges of the first signal to acquire the sample signals, and
   wherein the edges of the first signal occur at a rate of the first frequency $F1$.

2. The method according to claim 1, wherein S is greater than or equal to 2 when the K number of channel signals are synchronous.

3. The method according to claim 1, wherein S is greater than or equal to 16 when the K number of channel signals are asynchronous, and wherein the second frequency $F2$ is set to a frequency such that the second frequency $F2$ divided by the first frequency $F1$ is greater than K.

4. The method according to claim 1, wherein each of the data header and the data tail comprises a two bit number and wherein the reset format com rises one bit for each of the K number of channel signals between the two bit data header and the two bit data tail.

5. The method according to claim 1, wherein the data string further comprises a check bit used to check the accuracy of transmitting the data string.

6. A method for demultiplexing multi-channel signals, comprising:
   sampling a data string in a preset format by using a first signal, wherein the first signal is set to a first frequency $F2$;
   restoring a plurality of sample signals for a K number of channel signals according to the preset format of the data string, wherein the preset format of the data string comprises a data header, a data tail, and the plurality of sample signals for the K number of channel signals between the data header and the data tail; and
   restoring the K number of channel signals from the sample signals by using a second signal that has a second frequency $F1$,
   wherein a third frequency $F3$ represents a highest frequency of the K number of channel signals,
   wherein the second frequency $F1$ is S times as high as the third frequency $F3$,
   wherein S is the times of sampling by using the second signal in each period,
   wherein the first frequency $F2$ is set to a frequency such that the first frequency $F2$ is greater than or equal to a sum of K and Y multiplied by S and $F3$, that is, $F2 \geq (K+Y) \times S \times F3$,
   wherein K is a natural number greater than or equal to 2 that indicates the number of channel signals to demultiplex, Y is a sum of lengths of the data header and the data tail, S is the times of sampling, and $F3$ is the highest frequency amongst the K number of channel signals, wherein restoring the K number of channel signals from the sample signals by using the second frequency F1 comprises acquiring one to seven sampling points of the K channels of signals from the sample signals by using the second frequency F1, wherein the one to seven sampling points are acquired at one or more rising edges or falling edges of the second signal, wherein the rising edges or the falling edges correspond to the second frequency F1, and wherein each of K channels are sampled at a same time at the rising edges or the falling edges of the second frequency F1.

7. The method according to claim 6, wherein S is greater than or equal to 2 when the K number of channel signals are synchronous.

8. The method according to claim 6, wherein S is greater than or equal to 16 when the K number of channel signals are asynchronous, and wherein the first frequency F2 is set to a frequency such that the first frequency F2 divided by the second frequency F1 is greater than K.

9. The method according to claim 6, wherein each of the data header and the data tail comprises a two bit number, and wherein the preset format comprises one bit for each of the K number of channel signals between the two bit data header and the two bit data tail.

10. An apparatus for multiplexing multi-channel signals, comprising:
a sampling circuit configured to acquire a plurality of sample signals from a K number of channel signals by using a first signal;
a generation circuit configured to generate a data string containing the sample signals in a preset format, wherein the preset format comprises a data header, a data tail, and the plurality of sample signals from the K number of channel signals between the data header and the data tail; and
a sending circuit configured to send the data string to a high speed bus by using a second signal,
wherein the second signal is set to a second frequency F2,
wherein the first signal has a first frequency F1,
wherein a third frequency F3 represents a highest frequency amongst the K number of channel signals,
wherein the first frequency F1 is S times as high as the third frequency F3,
wherein S is the times of sampling using the first signal in each period,
wherein the second frequency F2 is set to a frequency such that the second frequency F2 is greater than or equal to a sum of K and Y multiplied and F3, that is, F2≥(K+Y)×S×F3,
wherein K is a natural number greater than or equal to 2 that indicates the number of channel signals to multiplex, Y is a sum of lengths of the data header and the data tail, S is the times of sampling, and F3 is the highest frequency amongst the K number of channel signals,
wherein the sampling circuit is further configured to sample each of the K number of channel signals at a same time at one or more rising edges or falling edges of the first signal,
wherein each of the K number of channel signals are sampled from one to seven times by using the rising edges of the first signal to acquire the sample signals, and
wherein the rising edges or the falling edges of the first signal correspond to the first frequency F1.

11. The apparatus according to claim 10, wherein S is greater than or equal to 2 based upon a determination that the K number of channel signals are synchronous.

12. The apparatus according to claim 10, wherein S is greater than or equal to 16 based upon a determination that the K number of channel signals are asynchronous, and wherein the second frequency F2 is set to a frequency such the second frequency F2 divided by the first frequency F1 is greater than K.

13. The apparatus according to claim 10, wherein each of the data header and the data tail comprises a two bit number, and wherein the preset format comprises one bit for each of the K number of channel signals between the two bit data header and the two bit data tail.

14. An apparatus for demultiplexing multi-channel signals, comprising:
a sampling circuit configured to sample a data string in a preset format by using a first signal, wherein the first signal is set to a first frequency F2;
a first restoration circuit configured to restore a plurality of sample signals for a K number of channel signals according to the preset format of the data string, wherein the preset format comprises a data header, a data tail, and the plurality of sample signals from the K number of channel signals between the data header and the data tail; and
a second restoration circuit configured to restore the K number of channel signals from the sample signals by using a second signal that has a second frequency,
wherein a third frequency F3 represents a highest frequency of the K number of channel signals,
wherein the second frequency F1 is S times as high as the third frequency F3,
wherein S is the times of sampling by using the second signal in each period,
wherein the first frequency F2 is set to a frequency such that the first frequency F2 is greater than or e sum of K and Y multiplied by S and F3, that is, F2≥(K+Y)×S×F3,
wherein K is a natural number greater than or equal to 2 that indicates the number of channel signals to demultiplex, Y is a sum of lengths of the data header and the data tail, S is the times of sampling, and F3 is the highest frequency amongst the K number of channel signals,
wherein the second restoration circuit is further configured to acquire less than eight sampling points of the K number of channel signals from the sample signals by using the second frequency F1,
wherein the less than eight sampling points are acquired at one or more edges of the second signal,
wherein the edges of the second signal occur at a rate of the second frequency F1, and
wherein each of the K number of channel signals are sampled at a same time at the edges of the second frequency F1.

15. The apparatus according to claim 14, wherein S is greater than or equal to 2 based upon a determination that the K channel signals are synchronous.

16. The apparatus according to claim 14, wherein S is greater than or equal to 16 based upon a determination that the K channel signals are asynchronous, and wherein the first frequency F2 is set to a frequency such that the first frequency F2 divided by the second frequency F1 is greater than K.

17. The apparatus according to claim 14, wherein each of the data header and the data tail comprises a two bit number and wherein the reset format comprises one bit for each of the K number of channel signals between the two bit data header and the two bit data tail.

* * * * *

UNITED STATES PATENT AND TRADEMARK OFFICE
CERTIFICATE OF CORRECTION

PATENT NO. : 9,219,561 B2
APPLICATION NO. : 13/309974
DATED : December 22, 2015
INVENTOR(S) : Konggang Wei Page 1 of 1

It is certified that error appears in the above-identified patent and that said Letters Patent is hereby corrected as shown below:

On the title page, item (30), Foreign Application Priority Data section should read:

Jun. 3, 2009 (CN) .............................. 200910145591.0

In the Claims:

Claim 4, Column 12, Lines 32-33 should read:

The method according to claim 1, wherein each of the data header and the data tail comprises a two bit number, and wherein the preset format comprises one bit for each of the K number of channel signals between the two bit data header and the two bit data tail.

Claim 17, Column 14, Line 67 and Column 15, Line 1 should read:

The apparatus according to claim 14, wherein each of the data header and the data tail comprises a two bit number, and wherein the preset format comprises one bit for each of the K number of channel signals between the two bit data header and the two bit data tail.

Signed and Sealed this
Twenty-third Day of August, 2016

Michelle K. Lee
*Director of the United States Patent and Trademark Office*